United States Patent [19]

Dolland

[11] 4,450,443
[45] May 22, 1984

[54] POSITION TRANSDUCER FOR DIGITAL SYSTEMS

[75] Inventor: Carlisle R. Dolland, Torrance, Calif.

[73] Assignee: The Garrett Corporation, Los Angeles, Calif.

[21] Appl. No.: 359,349

[22] Filed: Mar. 18, 1982

[51] Int. Cl.³ .......................... G08C 19/06; G01B 7/14
[52] U.S. Cl. ............................... 340/870.36; 318/657;
324/208; 340/870.32; 340/347 SH
[58] Field of Search ..................... 340/870.35, 870.36,
340/870.32, 347 SH; 324/208, 207; 318/657

[56] References Cited

U.S. PATENT DOCUMENTS

| | | | |
|---|---|---|---|
| 3,634,838 | 1/1972 | Granqyist | 340/870.32 |
| 3,684,961 | 8/1972 | Muir | 336/45 |
| 3,694,930 | 10/1972 | Howland et al. | 340/347 SH |
| 3,851,238 | 11/1974 | Fletcher et al. | 318/649 |
| 4,100,480 | 7/1978 | Lytle et al. | 324/207 |
| 4,103,233 | 7/1978 | Timmermans et al. | 324/208 |
| 4,107,603 | 8/1978 | Slough | 324/207 |
| 4,109,200 | 8/1978 | McMulty | 324/208 |
| 4,112,365 | 9/1978 | Larson et al. | 324/207 |
| 4,134,065 | 1/1979 | Bauer et al. | 324/208 |
| 4,140,998 | 2/1979 | Bettle | 318/657 |
| 4,170,754 | 10/1979 | Schmitz et al. | 324/208 |
| 4,198,006 | 4/1980 | Rolfe | 324/208 |
| 4,282,485 | 8/1981 | Pauwels et al. | 340/870.32 |
| 4,284,961 | 8/1981 | Landau | 324/208 |
| 4,297,698 | 10/1981 | Pauwels | 340/870.32 |

FOREIGN PATENT DOCUMENTS 1217340 12/1970 United Kingdom .

Primary Examiner—James J. Groody
Attorney, Agent, or Firm—James W. McFarland; Albert J. Miller

[57] ABSTRACT

A position transducer for indicating the position of a core member of a linear variable differential transformer produces DC level output signals proportional to changes occurring in the excitation and core displacement. Pulse signals from a clock source are converted to sinusoidal signals of a predetermined frequency and applied to the transformer. Movement of the core member varies the amplitude of the secondary waveform. To extract the position information the primary and secondary waveforms are applied to sample and hold circuits. These circuits receive gating signals to ensure the outputs of the primary and secondary sample and hold circuits acquire peak values of the sinusoidal input signals. The gating signals are derived by applying the sinusoidal primary waveform to a phase shift network. The resultant waveform is squared and used to trigger a one shot to produce a pulse train whose pulse width is 1/14 the period of excitation frequency. The sample and hold outputs are read by a CPU which computes the ratio of the secondary sample and hold output to the primary sample and hold output to determine the linear variable differential transformer displacement.

23 Claims, 2 Drawing Figures

POSITION TRANSDUCER FOR DIGITAL SYSTEMS

BACKGROUND OF THE INVENTION

1. Field of the Invention

This invention relates to an improved position transducer and more particularly to method and apparatus for indicating the position of a core member moved relative to a variable differential transformer.

2. Description of the Prior Art

One type of position transducer used in the prior art is a linear voltage differential transformer (LVDT). Typically, such a sensor generates an electrical signal proportional to the displacement of the transformer core with respect to a reference position in response to an external physical motion. The transformer core is generally of high permeability material which couples AC signals induced in the transformer primary into secondary windings of the transformer. The secondary voltage is attenuated by the core position and this induced voltage is either in phase or 180° out of phase with the excitation. In this manner the relative movement of the core controls the output of a modulator/demodulator network.

Normally in position transducers employing an LVDT the demodulators use precision full wave rectifiers and filters as described, for example, in U.S. Pat. No. 4,140,998. Recently the need for an LVDT in a digital system has become apparent. Since all analog to digital converters utilized in current digital systems are relatively fast, i.e., conversion of <30 μS, as compared to typical LVDT excitation frequencies, the lack of adequate demodulator output filtering could lead to system instability due to positive feedback. This positive feedback results from analog to digital conversion of the demodulated and filtered LVDT secondary waveform during the peak and subsequently the valley of the ripple. Thus, the system time constant is dictated by the tolerable ripple and is usually a minimum of twice the period of the excitation frequency.

SUMMARY OF THE INVENTION

In the position transducer employing an LVDT according to the present invention a pulse signal from a clock source is converted to a sinusoidal waveform of a predetermined frequency which is required for excitation of the LVDT. LVDT secondary waveform is modulated by the relative movement of the core member of the LVDT. The LVDT primary waveform is applied to a phase shift network. The output of the phase shift network is applied to a high gain squaring circuit to generate a square wave. This square wave is utilized to trigger a one shot which provides a gating signal to the primary and secondary sample and hold circuits. The waveform from the LVDT secondary is buffered by a differential amplifier in order to obtain a waveform referenced to the system ground. This waveform is applied to the secondary sample and hold circuit which is gated by the one shot. In this manner each of the primary and secondary sample and hold circuits produces DC voltages proportional to the peak of the LVDT primary and secondary waveforms. The response of the primary and secondary sample and hold outputs to changes in the LVDT is only one period of the excitation frequency. Furthermore the system has minimal ripple caused by the droop of the sample and hold circuit. This droop can easily be limited to 1 millivolt. By utilizing a gating signal pulse of a preselected width relative to the period of the excitation frequency, the sample and hold circuits acquire the primary and secondary sinusoidal waves within 0.5% of their peak value. With this approach any error due to phase shift between LVDT primary and secondary waveforms which typically is 3% is minimized.

It therefore is the primary object of the present invention to improve position transducers.

It is another object of the invention to enhance the performance of a modulator/demodulator network to indicate the position of a movable core member relative to a variable differential transformer.

It is still another object of the present invention to reduce the response time of a variable differential transformer indicating movement of the core member relative thereto.

It is still another object of the present invention to improve system performance of a variable differential transformer with modulator/demodulator network having zero ripple.

It is still a further object of the invention to provide method and apparatus for a variable differential transformer system compatible for use with a digital system.

DESCRIPTION OF THE PREFERRED EMBODIMENT

Figure 1:
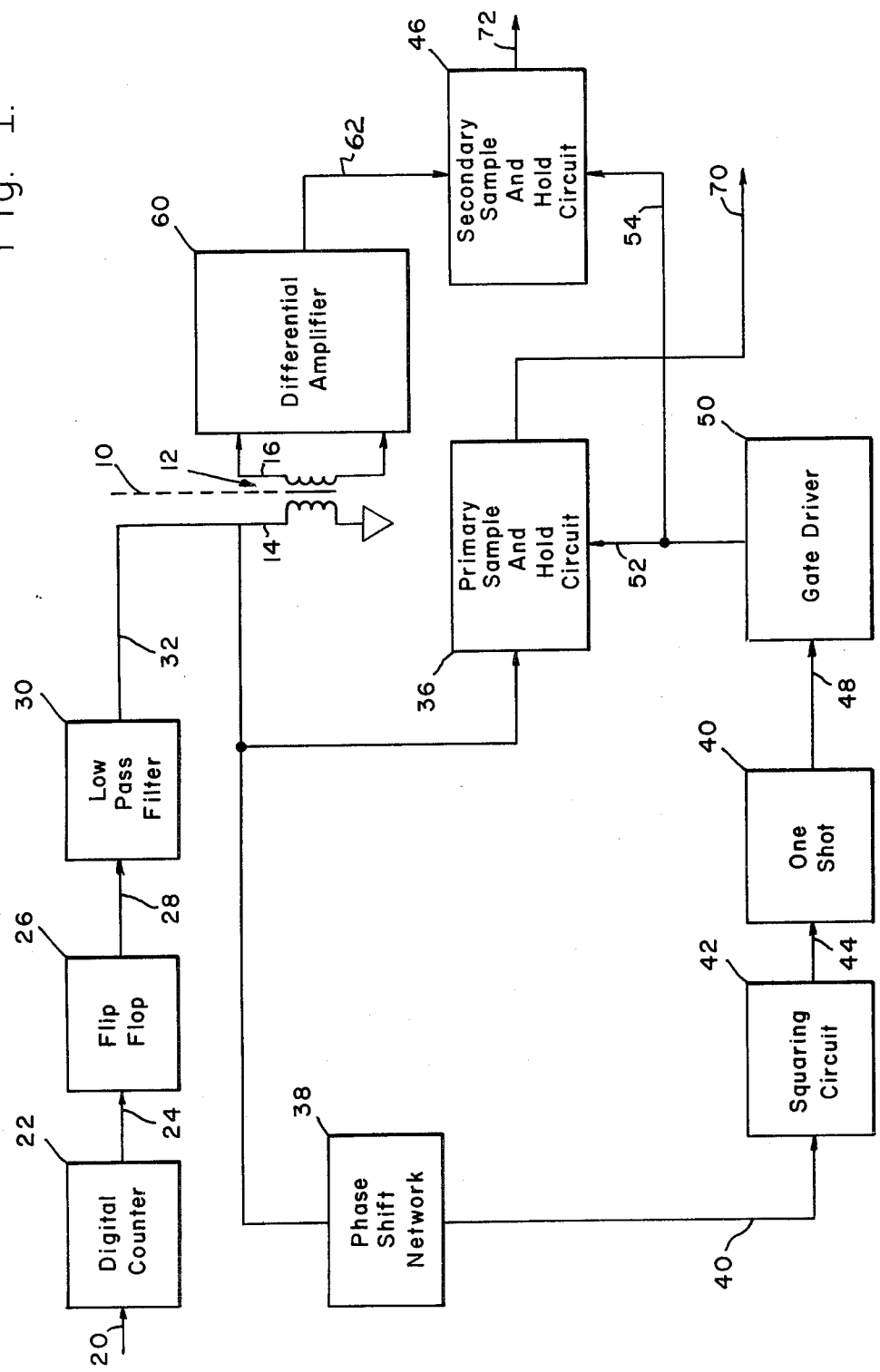
FIG. 1 is a block diagram of the position transducer system according to the present invention.

Referring now to FIG. 1 there is shown a block diagram of the position transducer having a primary 14 and a secondary 16. Movable member 10 varies the secondary 16 of the transducer with respect to the primary 14. It should be understood that transformer 12 may be a linear variable differential transformer (LVDT) or a rotary variable differential transformer (RVDT). The transducer uses a modulator/demodulator circuit which requires a stable clock signal 20, for example from a CPU clock (not shown). The signals 20 are divided in a digital counter 22 by a number N to obtain twice the appropriate LVDT excitation frequency. For purposes of this application a frequency of about 7.5 KHz has been used. The output 24 from divider 22 is supplied to a flip-flop circuit 26 to produce a precision bipolar square wave 28 at the required excitation frequency, 3.5 KHz. This square wave 28 is applied to a low pass filter 30 to produce a sinusoidal waveform 32.

Signal 32 is applied to primary 14 of LVDT 12, a primary sample and hold circuit 36, and a phase shift network 38. The phase shift network 38 shifts the phase of the primary waveform by a predetermined angle. In this particular application a phase shift of 84° is desirable. The resulting phase shifted signal 40 is supplied to a squaring circuit 42 to produce a square wave 44. The falling edge of this square wave is utilized to trigger a one shot 46 to produce a pulse train 48. The width of these pulses 48 is selected so that the falling edge of these pulses occurs at the peak of the LVDT primary and secondary sinusoidal waveforms. The pulse train 48 is applied to a gate driver 50 which translates this pulse train typically TTL to a level compatible with a sample and hold MOS type switch. The resultant gating signals 52 and 54 are utilized by sample and hold circuits 36 and 46, respectively. The period of the one shot is selected to produce a pulse width which provides a gating signal for the primary sample and hold circuit 36 and a secondary sample and hold circuit 46 which will be described more fully hereinafter. For this application a pulse width of 1/14 of the period of the excitation frequency is preferred. In this manner the peak values of the primary and secondary waveforms are acquired in the primary and secondary sample and hold circuits. The output of the LVDT secondary 16 is buffered by a differential amplifier 60 to produce an output signal 62 which is acquired by the secondary sample and hold circuit 46.

Figure 2:
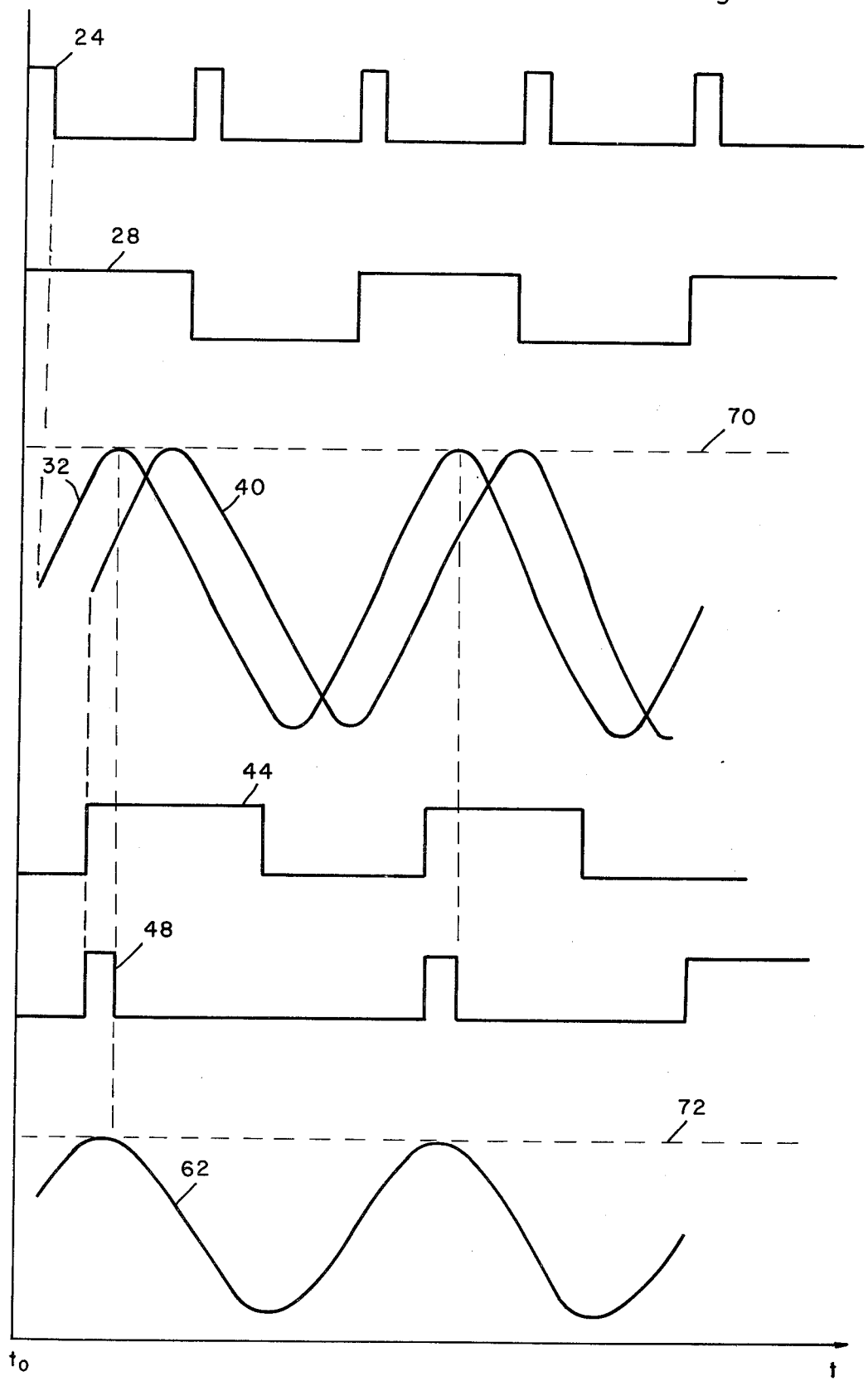
FIG. 2 is a timing diagram showing some of the waveforms that occur in the system shown in FIG. 1.

The sample and hold circuits 36 and 46 thus acquire the peak values of the primary and secondary sinusoidal waveforms. In this manner DC level signals 70 and 72 are produced which are proportional to the changes occurring in the LVDT primary and secondary, respectively. The waveforms of FIG. 2 illustrate the timing relationship between the signals discussed earlier. The sample and hold outputs 70 and 72 are then digitized for use in a digital system. This may be accomplished, for example, by A to D converters whose output is read by a CPU. The CPU can read both sample and hold outputs 70 and 72 and take the ratio and determine the position accurately.

It has been shown that in this modulator/demodulator system the sample and hold circuits acquire and retain primary and secondary sinusoidal waveforms, respectively, within 0.5% of their maxima. Furthermore, any error due to phase shift between primary and secondary waveforms which is typically about 3° is minimized. It has been found that by using a one shot with 2% accuracy over temperature, an overall position accuracy of 0.5% is easily attainable over the ambient temperature range −55° C. to +100° C. despite typical phase shift from primary to secondary of 3°.

The above described invention provides an improved position transducer using an LVDT with the described modulator/demodulator network to obtain optimal response to position changes. In contrast to the existing LVDT systems using a precision rectifier and filter, the disclosed mechanization provides a minimum ripple system whose response time is one period of the excitation frequency. Thus this invention provides significant improvement over the LVDT mechanizations which utilize precision full wave rectifiers and filters.

It should be apparent from the foregoing description that the present invention provides many advantages over the conventional position transducers. Although only a preferred embodiment is specifically illustrated and described herein, it will be appreciated that many modifications and variations of the present invention are possible in light of the above teaching to those skilled in the art.

What is claimed is:

1. Position transducer apparatus for indicating the position of a displaceable core means of a linear variable differential transformer comprising
   primary means producing a primary waveform,
   secondary means producing a secondary waveform,
   displaceable core means for causing attenuation in the secondary waveform in direct proportion to the displacement thereof,
   means for generating pulse signals at a predetermined frequency,
   filter means for receiving said pulse signals and producing sinusoidal signals for input to the primary means,
   phase shift means for receiving said sinusoidal signals to produce a predetermined phase shifted output,
   means including a one shot for receiving said phase shifted output and producing gate timing signals,
   primary and secondary sample and hold means receiving signals from said primary and secondary means, respectively, as a first input and said gate timing signals as a second input to produce DC level outputs proportional to the primary and secondary waveforms, respectively.

2. Apparatus according to claim 1 wherein the secondary means is buffered by a differential amplifier.

3. Apparatus according to claim 1 wherein the phase shift means produces a phase shift of about 84°.

4. Apparatus according to claim 1 wherein said one shot produces a signal pulse width of approximately 1/14 of the period of excitation frequency.

5. Position transducer apparatus for indicating the position of a displaceable core means of a linear variable differential transformer comprising
   primary means producing a primary waveform,
   secondary means producing a secondary waveform,
   displaceable core means for causing attenuation in the secondary waveform in direct proportion to the displacement thereof,
   means for generating pulse signals at a first predetermined frequency,
   means for dividing the pulses of the first frequency into a second predetermined frequency,
   flip-flop means for receiving the divided pulses and producing a precision bipolar waveform of exactly fifty percent of the duty cycle,
   filter means for receiving said bipolar waveform and producing sinusoidal signals for input to the primary means,
   phase shift means for receiving said sinusoidal signals to produce a predetermined phase shifted output,
   squaring means for receiving the phase shifter output to produce a square waveform,
   means including a one shot for receiving said square waveform and producing gate timing signals,
   primary and secondary sample and hold means receiving signals from said primary and secondary means, respectively, as a first input and said gate timing signals as a second input to produce DC level outputs proportional to the primary and secondary means, respectively.

6. A method of indicating position of a core member of a linear variable differential transformer having primary and secondary comprising the steps of generating pulse signals at a predetermined frequency and the filtering the pulse signals to produce sinusoidal signals therefrom as excitation signals to the primary of said transformer, shifting the phase of said sinusoidal signals by a predetermined angle and then squaring the phase shifted signals for triggering a one shot to produce a pulse train having a predetermined pulse width, and supplying said pulse train to gate a first sample and hold circuit acquiring waveforms from the primary and a second sample and hold circuit acquiring waveforms from the secondary to produce DC voltages proportional to the peak of the primary and secondary waveforms, respectively.

7. A method according to claim 6 wherein the phase shift is about 84°.

8. A method according to claim 6 wherein the pulse width of the one shot output is about 1/14 of the period of the sinusoidal excitation frequency.

9. A method according to claim 6 including converting the outputs of the primary and secondary sample and hold circuits to digital information.

10. In a variable differential transformer having a primary and secondary respectively producing primary and secondary waveforms, and displaceable core means for altering the secondary waveform; apparatus for indicating the position of the displaceable core means comprising:
  first means for producing a sinusoidal signal of predetermined frequency and operably arranged whereby said sinusoidal signal is delivered to said primary of the transformer;
  second means receiving said sinusoidal signal for producing a predetermined phase shifted output signal;
  third means receiving said phase shifted output signal for producing gate timing signals;
  primary sample and hold means receiving said primary waveform and said gate timing signals, for producing a DC level output signal proportional to said primary waveform; and
  secondary sample and hold means receiving said secondary waveform and said gate timing signals, for producing a DC output signal proportional to said secondary waveform.

11. The invention of claim 10, wherein said first means includes means for generating pulse signals at predetermined frequency.

12. The invention of claim 11, wherein said first means further includes filter means receiving said pulse signals for producing said sinusoidal signal for delivery to said primary means and said second means.

13. The invention of claim 11, wherein said means for generating pulse signals includes a digital counter for establishing the frequency of said pulse signals to be approximately twice the excitation frequency of said variable differential transformer.

14. The invention of claim 13, wherein said means for generating pulse signals further includes a flip-flop for producing a bipolar square wave at said excitation frequency.

15. The invention of claims 10, 11, 12, 13 or 14, wherein said second means includes a phase shift network for shifting the phase of said sinusoidal signal by a predetermined angle.

16. The invention of claim 15, wherein said predetermined angle is approximately 84°.

17. The invention of claim 15, wherein said second means further includes a squaring circuit receiving said phase shifted sinusoidal signal and producing a square wave output.

18. The invention of claim 17, wherein said second means also includes a one shot triggered by the falling edge of said square wave output to produce a pulse train whose pulses have a width such that the falling edges thereof occur at the peak of said primary and secondary waveforms.

19. The invention of claim 18, wherein said second means further includes a gate driver receiving said pulse train for generating said gating signals.

20. The invention of claim 18, wherein said width of the pulses is approximately 1/14 of the period of the excitation frequency of said variable differential transformer.

21. The invention of claim 10, further including a differential amplifier operably disposed between said secondary and said secondary sample and hold circuit for buffering said secondary waveform.

22. In a variable differential transformer having a primary and secondary respectively producing primary and secondary waveforms, and displaceable core means for altering the secondary waveform; apparatus for indicating the position of the displaceable core means comprising:
  means for generating pulse signals at a predetermined frequency,
  filter means for receiving said pulse signals and producing sinusoidal signals for input to said primary,
  phase shift means for receiving said sinusoidal signals to produce a predetermined phase shifted output,
  means including a one shot for receiving said phase shifted output and producing gate timing signals,
  primary and secondary sample and hold means receiving signals from said primary and secondary, respectively, as a first input and said gate timing signals as a second input to produce DC level outputs proportional to the primary and secondary waveforms, respectively.

23. A method of determining the position of a core member of a variable differential transformer having primary and secondary windings comprising the steps of:
  generating sinusoidal signals at a predetermined frequency as excitation signals to the primary winding;
  shifting the phase of said sinusoidal signals;
  producing gate timing signals from the phase shifted signals;
  gating with said gate timing signals, a first sample and hold circuit acquiring waveforms from the primary to produce a DC voltage proportional to the peak of the primary waveform; and
  gating with said gate timing signals, a second sample and hold circuit acquiring waveforms from the secondary to produce a DC voltage proportional to the peak of the secondary waveforms.

* * * * *